(12) United States Patent
Wahabzada et al.

(10) Patent No.: US 11,719,858 B2
(45) Date of Patent: Aug. 8, 2023

(54) DETERMINATION OF LOCATION-SPECIFIC WEATHER INFORMATION FOR AGRONOMIC DECISION SUPPORT

(71) Applicant: BASF Agro Trademarks GmbH, Ludwigshafen am Rein (DE)

(72) Inventors: Mirwaes Wahabzada, Langenfeld (DE); Holger Hoffmann, Langenfeld (DE); Eva Hill, Langenfeld (DE); Ole Peters, Langenfeld (DE); Christian Kerkhoff, Langenfeld (DE); Umit Baran Ilbasi, Langenfeld (DE); Priyamvada Shankar, Langenfeld (DE)

(73) Assignee: BASF Agro Trademarks GmbH, Ludwigshafen am Rhein (DE)

( * ) Notice: Subject to any disclaimer, the term of this patent is extended or adjusted under 35 U.S.C. 154(b) by 0 days.

(21) Appl. No.: 17/055,432

(22) PCT Filed: May 14, 2019

(86) PCT No.: PCT/EP2019/062315
§ 371 (c)(1),
(2) Date: Nov. 13, 2020

(87) PCT Pub. No.: WO2019/219664
PCT Pub. Date: Nov. 21, 2019

(65) Prior Publication Data
US 2021/0223433 A1    Jul. 22, 2021

(30) Foreign Application Priority Data
May 16, 2018 (EP) .................................... 18172567

(51) Int. Cl.
*G01W 1/10* (2006.01)
*G06F 30/27* (2020.01)
(Continued)

(52) U.S. Cl.
CPC ................ *G01W 1/10* (2013.01); *G01W 1/06* (2013.01); *G06F 30/27* (2020.01);
(Continued)

(58) Field of Classification Search
CPC ..... G01W 1/10; G01W 1/06; G01W 2203/00; G01W 2201/00; G06F 30/27;
(Continued)

(56) References Cited

U.S. PATENT DOCUMENTS

| 2014/0372038 A1 | 12/2014 | LeBlanc | |
| 2017/0131435 A1* | 5/2017 | Peacock | G01W 1/10 |
| 2017/0371074 A1* | 12/2017 | Elkabetz | G01S 13/95 |

FOREIGN PATENT DOCUMENTS

| EP | 1744185 A1 | 1/2007 |
| EP | 3 343 249 A1 | 7/2018 |

(Continued)

OTHER PUBLICATIONS

Flint et al. (Downscaling future climate scenarios to fine scales for hydrologic and ecological modeling and analysis, Flint and Flint Ecological Processes 2012) (Year: 2012).*

(Continued)

*Primary Examiner* — Daniel R Miller
*Assistant Examiner* — Christian T Bryant
(74) *Attorney, Agent, or Firm* — Lowenstein Sandler LLP

(57) ABSTRACT

A method performed by at least one apparatus is inter alia disclosed, said method comprising: obtaining weather model data indicative of location-specific weather information for a first set of locations (26) on a first grid (28); obtaining an area of interest (30) associated to at least one user (32); obtaining and/or determining a second set of locations (34) based on a second grid (36) within said area of interest (30); obtaining measurement data on location-specific weather information of a measurement device associated to said at (Continued)

least one user located at a measurement location (38) within and/or proximate to said area of interest (30); and determining, based on at least said obtained weather model data and said obtained measurement data, location-specific weather information for said second set of locations (34) based on said second grid (36).

17 Claims, 4 Drawing Sheets

(51) Int. Cl.
*G01W 1/06* (2006.01)
*G06N 20/00* (2019.01)
*H04W 4/021* (2018.01)

(52) U.S. Cl.
CPC .... *G01W 2201/00* (2013.01); *G01W 2203/00* (2013.01); *G06N 20/00* (2019.01); *H04W 4/021* (2013.01); *Y02A 90/10* (2018.01)

(58) Field of Classification Search
CPC ......... Y02A 90/10; H04L 67/18; H04L 4/024; G06N 20/00; H04W 4/021
See application file for complete search history.

(56) References Cited

FOREIGN PATENT DOCUMENTS

| WO | WO-2017070199 A1 * | 4/2017 | .............. G01W 1/00 |
|----|--------------------|--------|--------------------------|
| WO | WO-2017/156325 A1  | 9/2017 |                          |

OTHER PUBLICATIONS

Bürgmann et al. (Synthetic Aperture Radar Interferometry to Measure Earth's Surface Topography and Its Deformation, Annual Review of Earth and Planetary Sciences, vol. 28:169-209 (Volume publication date May 2000), https://doi.org/10.1146/annurev.earth.28.1.169) (Year: 2000).*
Wildey (Topography from Single Radar Images, 1984, Science, vol. 224, Issue 4645, p. 153-156, doi:10.1126/science .224.4645.153) (Year: 1984).*
Hoar et al. ("Statistical downscaling of the Community Climate System Model (CCSM) monthly temperature and precipitation projections", White Paper, Apr. 2008) (Year: 2008).*
Hoai et al. (Downscaling Global Weather Forecast Outputs Using ANN for Flood Prediction, Hindawi Publishing Corporation, Journal of Applied Mathematics, vol. 2011, Article ID 246286, 14 pages, doi:10.1155/2011/246286) (Year: 2011).*
Maraun et al. ("Precipitation Downscaling Under Climate Change: Recent Developments To Bridge The Gap Between Dynamical Models And The End User",Rev. Geophys., 48, RG3003, doi:10.1029/2009RG000314, 2010 ) (Year: 2010).*
Wiki (LIDAR Contour Mapping, wiki.gis.com, May 10, 2011, http://wiki.gis.com/wiki/index.php?title=LIDAR_Contour_Mapping&oldid=73269) (Year: 2011).*
Cheesman (The role of topography and plant functional traits in determining tropical reforestation success. J Appl Ecol. 2018; 55:1029-1039. https://doi.org/10.1111/1365-2664.12980) (Year: 2018).*
European Search Report for EP Patent Application No. 18172567.2, dated Nov. 29, 2018, 3 pages.
International Search Report for International Application No. PCT/EP2019/062315 dated Jul. 15, 2019, 2 pgs.
Maraun et al., "Precipitation downscaling under climate change: Recent developments to bridge the gap between dynamical models and the end user", Review of Geophysics, Jan. 1, 2010, 34 pgs., vol. 48, No. 3, The American Geophysical Union.

* cited by examiner

DETERMINATION OF LOCATION-SPECIFIC WEATHER INFORMATION FOR AGRONOMIC DECISION SUPPORT

FIELD OF THE DISCLOSURE

The invention relates to the field of the determination of location-specific weather information, which may be used for purposes of agronomic decision support.

BACKGROUND

Digital solutions are increasingly used in the field of agronomy. Agronomic decisions can be supported by means of support models and methods, which may provide suggestions and predictions for operational decisions, in particular in regard to selecting the right seed, the targeted use of crop protection agents and agricultural production inputs, as well as appropriate scheduling of site-specific farming measures.

In particular, agronomic decisions support methods and models may be based on geobasic data and statistics. For example, geobasic data such as soil, climate, terrain and usage parameters are modeled in relation to their consequences on agricultural processes. Further, such models are also important to achieve sustainable agricultural strategies, minimizing harm to the environment and avoiding damage to adjacent natural ecosystems when farming agricultural land.

Precise weather and soil data are becoming increasingly important in modern agriculture to optimize crop-growing and the deployment of available agricultural resources. There have been considerable improvements in the development of accurate weather data, owing to the evolution of global and regional weather models, as well as to the increase in available computational resources.

However, even in light of these improvements, due to restrictions still existing in the weather models, spatial resolution of weather data available to farmers has typically resolutions on scales in the order of several kilometers. Numerical methods for the determination of weather data with finer resolutions are often not based on a dynamic scheme to provide time-dependent weather data.

The relevant scales for weather data for agronomic decision support are however rather determined by the size of an agricultural field, i.e. the size of arable land cultivated by the farmer, and may be in the order of hundreds of meters, tens of meters or even smaller.

Therefore, farmers often rely on local weather stations in making agronomic decisions. A local weather station may be associated with the farmer and comprise measurement devices providing location-specific weather data. Such weather stations may be positioned within the field or proximate to the field for which the farmer requires precise weather data.

However, such weather stations do not provide spatial resolution, as the weather station is typically only present at a fixed location and only provides weather data on that specific fixed location. Measurement data from single weather stations therefore do not meet the requirement of being representative of weather conditions on the relevant spatial scales. In extreme cases, weather conditions may vary strongly even within a single agricultural field, with distances of only hundreds or tens of meters leading to deviations significant for the precision of agronomic support models.

The lack of spatial resolution of weather stations may be compensated by providing multiple weather stations at different locations. Weather stations are however expensive and operating expenses would therefore be increased.

For more precise agronomic decision support, methods to obtain weather data on fine spatial resolutions (so-called hyperlocal scales) are therefore needed. In particular, it would be desirable to provide such weather data on relevant scales comparable to the size of the agricultural field.

WO 2017/156325 A1 discloses a method for long-range temperature forecasting.

SUMMARY OF SOME EMBODIMENTS OF THE INVENTION

In view of this, certain aspects and embodiments according to the invention may allow for the determination of location-specific weather information on hyperlocal scales. Certain aspects and embodiments according to the invention may allow for the enhancement of weather model data, such as weather model data based on a coarse spatial resolution, by reflecting localized measurement data associated to a user and/or provided by the user. Further, certain aspects and embodiments according to the invention may allow incorporating geobasic data in the determination of location-specific weather information on hyperlocal scales.

According to a first exemplary aspect of the invention, a method performed by at least one apparatus is described, said method comprising: obtaining weather model data indicative of location-specific weather information for a first set of locations on a first grid; obtaining an area of interest associated to at least one user; obtaining and/or determining a second set of locations based on a second grid within said area of interest; obtaining measurement data on location-specific weather information of a measurement device associated to said at least one user located at a measurement location within and/or proximate to said area of interest; and determining, based on at least said obtained weather model data and said obtained measurement data, location-specific weather information for said second set of locations based on said second grid.

For instance, the weather model data may be data generated on basis of a global and/or local weather model. The weather model data may be generated dependent on location-specific weather information provided by a weather station network, such as a weather station network provided by an external entity different from the at least one user. Weather model data may be at least partially based on simulated data from a forecast model. The forecast model may be implemented by computer simulations (e.g. climate or numerical weather prediction models—NWP). The forecast model may be based on an icosahedral nonhydrostatic model (ICON). Simulated data may in addition or as alternative incorporate re-analysis of previously obtained weather model data. The weather model data obtained in the method can be provided by an external entity different from the at least one user, in particular by an external service provider that may be a public or commercial provider. The weather model data may for instance be obtained from data provided by organizations such as Deutscher Wetterdienst (DWD) or European Centre for Medium Range Weather Forecasting (ECMWF).

The location-specific weather information is in particular understood to be information indicative of weather conditions depending on (and/or possibly varying with) the location. A location may be indicated by a spatial position (or an estimate thereof), e.g. latitude and longitude, height (e.g.

above ground or sea level) and/or orientation (e.g. in relation to cardinal direction). The location-specific weather information may for instance be representative of a certain position on the earth's surface. The location-specific weather information may comprise information on a position and/or orientation in a three-dimensional space, for instance three parameters representative of a position and/or orientation in three dimensions. The location information may for instance comprise absolute values or relative values with respect to a fix point.

The location-specific weather information does not need to be unique at a certain location and there may also be multiple locations at which the same value of the weather information may be found. The location-specific weather information may comprise a value, which may be representative of a (characteristic) parameter of the weather conditions, such as the air temperature or wind speed, for example.

The obtained weather model data is indicative of location-specific weather information for a first set of locations on a first grid. The first set of locations may be restricted to one or more (local) areas or may be distributed globally. The first set of locations is in particular predetermined by the conditions of the generation of the weather model data, e.g., the first set of locations may be predetermined by the external service provider generating and/or providing the weather model data. The first set of locations is in particular dependent on the type of model(s) that is/are used in the simulated data for the weather model data. The first set of locations may also relate to a weather station network that is utilized in the generation of the weather model data.

The first grid is not restricted to an evenly spaced grid with an evenly spaced first set of locations. The first grid may in this regard also be irregular. The first grid may however be a grid for the first set of locations forming lines in one or more map projections of the globe, with at least a part of the first set of locations being located on the lines. The lines may be parallel within the one or more map projections. The first grid may be a regular grid, in particular such that the first grid represents locations forming parallel and perpendicular lines covering at least a part of the first locations, which parallel and perpendicular lines may in addition be evenly spaced. For instance, the first set of locations on the first grid may be at least partially evenly spaced in that at least a part of the first set of locations are representative of locations having (approximately, i.e. within a given margin) equal distances to their respective nearest neighboring locations of the first set of locations. In particular, the first grid may be a rectangular or square grid.

The area of interest may be representative for one or more areas on the globe that is delimited by a border of the area of interest. For example, an area of interest may refer to an area of land, in particular arable land, such as farmland, one or more adjacent or separated agricultural fields, one more catchment areas (meteorologically related areas), an area of one or more lake(s) and/or water stream(s). The area of interest is associated to at least one user, which may for example be the farmer, owner or tenant (famer) of land forming at least part of the area of interest. The user may further be a person associated with the farmer, owner or tenant (farmer) of the areas forming at least part of the area of interest, such as an employee of the farmer, owner or tenant (farmer). The area of interest may further relate to the measurement location of the measurement device associated to the at least one user. For instance, the area of interest may be an area around the measurement location, e.g. a circular area with a given radius or a rectangular area with given size and width around the measurement location.

The first grid may be representative for a "coarse" grid in the sense that the first grid has characteristic dimensions comparable or larger than characteristic dimensions of the area of interest. For instance, dimensions of the area of interest such as length, width and size of area may be comparable (e.g., in the same order of magnitude) or smaller (e.g. at least one order of magnitude smaller) than dimensions of the first grid, such as mean and/or minimal distance of nearest neighboring locations of the first set of locations, mean and/or minimal distance of lines of locations, and/or length, width and size of an area relating to the first grid. For instance, none or less than a predefined number of locations of the first set of locations are located within and/or proximate to the area of interest.

Information relating to the area of interest may be provided by the at least one user, e.g. by providing locations referring to a border of the area of interest. The user may for example provide information on the measurement location. The area of interest may also be chosen by the at least one user from a group of predefined areas.

The second set of locations is based on the second grid within said area of interest. The second set of locations may comprise locations being entirely within the area of interest and/or the border of the area of interest. The second set of locations may be provided by the at least one user, e.g. in that the user specifies specific points of interest or selects specific points of interest from a predefined group of locations. The predefined group of locations may be determined, e.g. on basis of the characteristics of the area of interest. Additionally or alternatively, the second grid may be determined, in particular based on characteristics of the grid, e.g. mean and/or minimal distance of locations and/or lines of locations. The characteristics of the second grid may be predefined and/or provided or chosen by the at least one user.

The second grid is not restricted to an evenly spaced grid and may be irregular. The second grid may be however be a regular grid, in particular such that the second grid represents locations forming parallel and perpendicular lines with at least a part of the second locations, which parallel and perpendicular lines may in addition be evenly spaced. For instance, the second set of locations on the second grid may be at least partially evenly spaced in that at least a part of the second set of locations are representative of locations having (approximately, i.e. within a given margin) equal distances to their respective nearest neighboring locations of the second set of locations. The second grid may be a rectangular or square grid.

The second grid may be representative for a "fine" grid in the sense that the second grid has characteristic dimensions comparable or smaller than characteristic dimensions of the area of interest. For instance, dimensions of the area of interest such as length, width and size of area may be comparable (e.g., in the same order of magnitude) or larger (e.g. at least one order of magnitude smaller) than dimensions of the second grid, such as mean and/or minimal distance of nearest neighboring locations of the second set of locations, mean and/or minimal distance of lines of locations, and/or length, width and size of area relating to the second grid. In particular, the second grid may have characteristic dimensions that are smaller than characteristic dimensions of the first grid. In particular, the first grid is considered "coarse" and the second grid is considered "fine" in the aforementioned sense. Further, the first set of locations may be different from the second set of locations in that at least some or all of the locations within the first set of locations do not correspond to any of the locations of the second set of locations.

At least one measurement device may be associated with the at least one user. In particular, the at least one user may be the owner or leaser of the at least one measurement device. The measurement device may be a local weather station or a mobile sensor device associated with said at least one user. The measurement device may comprise at least one sensor means that is configured to determine at least one quantity indicative for a (characteristic) parameter of the weather conditions, such as the air temperature or wind speed, for example. The measurement device may be local, i.e. the measurement device may be sensitive only to (characteristic) parameters of the weather conditions at the location of the measurement device or within a limited ranged around the location of the measurement device. In particular, the measurement device may be sensitive to at least one in-situ weather parameter. The measurement device may be located at a fixed location. Alternatively, the measurement device may be mobile and may be associated with a vehicle, for example. The measurement device may also be associated with a mobile device, such as a portable sensor device.

The measurement device may be located at a measurement location within and/or proximate to said area of interest. Proximate to said area of interest may include locations within a (nearest) distance of the measurement location to the area of interest below a predefined maximum distance, which may be related or equal to characteristic dimensions of the first grid, the second grid and/or the area of interest.

Location-specific weather information for said second set of locations based on said second grid is determined. This determination is in particular based on at least said obtained weather model data and said obtained measurement data. In particular, the first grid is considered "coarse" and the second grid is considered "fine" in the aforementioned sense. The determination for the location-specific weather information for said second set of locations may comprise one or more steps of a downscaling process of the obtained weather model data. One more steps of the downscaling process may take into account or may be based on at least part of said obtained measurement data.

For instance, the determination may represent a regionalization of the weather model data in that non-regional or global weather model data is used to obtain weather conditions on a regional scale based on the second set of locations.

As the determined location-specific weather information for the second set of locations is at least based on both the obtained weather model data and the obtained measurement data, the weather model data, which may be based on computer simulations on a more "coarse" grid, may effectively be fused with the measurement data. The measurement data may in this regard indicate information on "ground truth", e.g. the actual local weather conditions at the measurement location. The ground truth may thus be used to correct, verify, and/or select weather model data and yield more accurate output relating to location-specific weather information for the second set of locations based on the second grid. The second grid may represent a "fine" grid, wherein the downscaling of the weather model data from a "coarse" first grid may be significantly be enhanced by incorporating ground truth data.

In particular, the second set of locations based on the second grid may represent specific local points of interest related to relevant factors for agronomic decision support. Location-specific weather information may be obtained on fine spatial resolutions (e.g. so-called hyperlocal scales), such as on relevant scales comparable to the size of an agricultural field located within the area of interest. The method according to the first exemplary aspect may therefore provide precise location-specific weather information without the need to acquire and maintain further measurement devices such as local weather stations by using already available resources like weather model data from external service providers.

For instance, at least one apparatus involved in performing the method according to the first exemplary aspect of the invention may be a mobile terminal, such as a cellular phone, a laptop computer, a tablet computer, a multimedia player, a personal digital assistant, or a part thereof. For instance, the apparatus is or forms a part (e.g. as a module) of a mobile terminal.

For instance, the area of interest, measurement data may be determined by and/or obtained from such a mobile terminal or a part thereof. However, the measurement data may also be obtained from a remote server based on measurement data that is in particular determined by and/or obtained from the mobile terminal.

The mobile terminal may for instance provide the weather model data, area of interest, second set of locations and/or measurement data to the apparatus(es) for performing the method according to the first aspect. The apparatus(es) may obtain the weather model data, area of interest, second set of locations and/or measurement data from one or more mobile terminals, for example. The apparatus(es) performing the method according to the first aspect may obtain the measurement data for instance by receiving the measurement data and/or the location information from a mobile terminal. The apparatus(es) performing the method according to the first aspect may also obtain the measurement data and/or the location information from multiple mobile terminals, for instance. The mobile terminals may for example provide the measurement data and/or the associated location information to the apparatus(es), for instance regularly or on demand.

Thus, the apparatus(es) to perform the method according to the first aspect or at least parts thereof can be one or more servers. A server is to be understood to mean, in particular, a data-processing unit in a network which communicates via the network with one or more data-processing units, the clients (e.g. the one or more mobile terminals), in order to provide them with special services and/or computing power. In a client-server architecture of this type, the special services provided by the server and/or the computing power can be used by a plurality of clients so that the clients themselves, for example, have to retain less own computing power or, as another example, do not need to be provided with a larger database. A server and a client can designate both a data-processing apparatus and a program which is executed on the data-processing apparatus. The network is, for example, a local area network, a wide area network, a virtual network, a radio network, a telephony network and/or the Internet. The communication is effected, for example, in a wireless or wire bound manner.

The servers may, for example, be database servers. Examples of a database server are a Microsoft SQL Server, an Oracle server and a MySQL server. The servers may, for example, be part (for example a "component") of a so called computer cloud which makes data-processing resources available dynamically to different users via a network. A computer cloud is intended to be understood to mean, in particular, a data-processing infrastructure according to the definition of the "National Institute for Standards and Technology" (NIST) for the term "Cloud Computing". An example of a computer cloud is a Microsoft Windows Azure Platform.

However, it is also possible that the apparatus(es) as another example may be a mobile terminal, for instance the mobile terminal itself, which measured the measurement data. That is, the mobile terminal may be integrated in the measurement device.

The weather model data, area of interest, second set of locations and/or measurement data may be stored in data sets, for instance. A data set for location-specific weather information may comprise a pair of a weather parameter and respective associated location information, for instance.

According to an exemplary embodiment of the method according to the first aspect, user information relating at least to the measurement device and/or the area of interest and may be obtained. For instance, the user information is provided by the user. In particular, a user may register for a database of user accounts. When the user account has been registered, computing resources may be allocated to the determination of the location-specific weather information based on the second grid in the particular area of interest associated with this user. Therefore, the location-specific weather information based on the second grid need only be determined for a limited number of areas of interest, saving computing resources.

The method according to the first aspect may comprise an authentication of the at least one user, e.g. according to an authentication scheme as stored in a database of user accounts such as a user login with a password.

According to an exemplary embodiment of the method according to the first aspect, the method comprises further: obtaining elevation model data indicative of a surface elevation for at least one location within and/or proximate to said area of interest; wherein said determining of said location-specific weather information for said second set of locations is further based on said elevation model data. In particular, the weather model data may be based on a first grid with a resolution that may be lower than typical sizes of boundary conditions such as surface elevation, e.g. the shape of mountains, hills, lakes, water streams or valleys. Such boundary conditions may for example have an impact on wind such as the occurrence of valley winds, (orographic) precipitation and temperature, and may be incorrectly represented in such weather model data. Basing the determination of said location-specific weather information for said second set of locations further on obtained elevation model data therefore may correct the location-specific weather information in regard to these boundary conditions.

For instance, elevation model data may be represented by a (high-resolution) digital elevation model (DEM). In particular, the resolution of the DEM may be higher (e.g. at least one order of magnitude) than the resolution of the first grid and/or second grid. In particular, the resolution of the DEM may be at least comparable to the resolution of the second grid. The DEM may take the form of a three-dimensional representation of the surface, in particular in and/or in proximity to the area of interest. The DEM may be obtained from an external provider different from the at least one user.

Determining of said location-specific weather information for said second set of locations may be further based on said elevation model data by incorporating a parametrization step. For instance, shadowing effects to the wind profile and/or adiabatic corrections may be parametrized, such that these effects may be modeled accurately.

In case the determining of said location-specific weather information for said second set of locations would be based on the weather model data and elevation model data (without including said measurement data), the location-specific weather information for said second set of locations could still be biased as physical processes like cloud formation or precipitation would only be taken into account based e.g. on a "coarse" first grid of the weather model data. As the method according to the invention further incorporates the measurement data, in particular ground truth data, the precision of the location-specific weather information for the second set of locations can be improved.

According to an exemplary embodiment of the method according to the first aspect, said determining of said location-specific weather information for said second set of locations comprises a spatial interpolation of said weather model data on said second set of locations; and/or a spatial interpolation of said measurement data on said second set of locations. A spatial interpolation of the elevation model data may also be used in case the resolution of the elevation model data is not sufficient. Spatial interpolation may be based on statistical processes, such as clustering, dimension reduction, time series analysis, regression models, Gaussian processes and in particular kriging. For instance, spatial interpolation such as kriging is used to predict the location-specific weather information for the second set of locations based on the weather model data. For instance, spatial interpolation is used to predict the location-specific weather information for the measurement location(s) based on the weather model data. In case measurement data is obtained for multiple measurement locations, e.g. from several measurement devices, spatial interpolation of measurement data may be performed to obtain intermediate values on the first or second grid. Spatial interpolation may yield accurate results for a downscaling on the second grid, while the computational effort may be kept low.

According to an exemplary embodiment of the method according to the first aspect, the method further comprises: determining location-specific bias information based on deviations of said obtained weather model data and/or said obtained measurement data; wherein said determining of said location-specific weather information for said second set of locations is further based on said location-specific bias information. In particular, location-specific bias information may be indicative of a difference of said obtained weather model data and said obtained measurement data, in particular at referring to one or more locations of the first set of locations, second set of locations and/or the measurement location(s). The difference may be utilized to use the measurement data as ground truth observations.

In a simple embodiment, the location-specific bias information may be used in a minimization scheme, e.g. determining the location-specific weather information for the second set of locations with minimal or vanishing location-specific bias information.

According to an exemplary embodiment of the method according to the first aspect, the method further comprises: determining at least one field parameter of a statistical model based at least partially on said location-specific bias information, wherein said determining of said location-specific weather information for said second set of locations is further based on said statistical model using said at least one field parameter. The at least one field parameter may for example represent at least one parameter characteristic of the area of interest in relation to the location-specific bias information, e.g. the at least one field parameter may be characteristic of shadowing effects to the wind profile and/or adiabatic corrections of the area of interest that are expressed within the statistical model. In particular, the at least one field parameter may be at least one parameter of a statistical processes such as clustering, dimension reduction, time series analysis, regression models, Gaussian processes and in particular kriging.

According to an exemplary embodiment of the method according to the first aspect, the method further comprises: carrying out at least one machine learning process based at least partially on said location-specific bias information to obtain at least one field parameter of a model for said location-specific bias information, wherein said determining of said location-specific weather information for said second set of locations is further based on said model for said location-specific bias information using said at least one field parameter. The at least one field parameter is in particular at least one parameter of a statistical model as described above. Carrying out at least one machine learning process to obtain at least one field parameter may be used to exploit commonalities in the model, e.g. the (re-)occurrence and/or correlation of a certain type or distribution of the location-specific bias information under different weather conditions and/or at different points in time.

A machine learning process may be understood in that an artificial apparatus or system (such as a aforementioned apparatus or system for performing the method according to the first aspect) is able to initiate a learning phase based on examples (e.g. specific combinations of weather model data, measurement data, and/or elevation model data and location-specific weather information for the second set of locations) and may generalize the examples after completing the learning phase. That is, the artificial apparatus or system is not merely storing the examples, but the effort is made to recognize patterns and regularities within the examples. Different approaches may be used for a machine learning process. For example, supervised learning, semi-supervised learning, unsupervised learning, reinforced learning and/or active learning schemes may be utilized, in particular in conjunction with deep learning or very deep learning methods. Supervised learning may for example be carried out by means of an artificial neural network (e.g. a recurrent neural network) or by means of a support vector machine. Also unsupervised learning can for example be carried out by means of an artificial neural network (e.g. an autoencoder). As examples or input for the machine learning, in particular the weather model data, measurement data, and/or elevation model data and location-specific weather information for the second set of locations may be used.

According to an exemplary embodiment of the method according to the first aspect, said determining of said location-specific weather information for said second set of locations comprises a spatial process model of said weather model data and said obtained measurement data on said second set of locations. The spatial process model may be a spatial process regression model. In particular, the spatial process model may be based on Markov random field conditions (Markov random field priors) to reduce computational effort.

According to an exemplary embodiment of the method according to the first aspect, the method further comprises: obtaining and/or determining a third set of locations based on a third grid within said area of interest; obtaining surface topography data for at least one location within and/or proximate to said area of interest; determining, based on said obtained surface topography data and said determined location-specific weather information for said second set of locations, location-specific weather information for said third set of locations based on said third grid.

In particular, determining location-specific weather information for said third set of locations based on said third grid may incorporate a downscaling process of the location-specific weather information from the second to the third grid. This may represent in particular a second downscaling process after a first downscaling process from the first to the second grid. The location-specific weather information on the third grid may be inter alia be determined based on the aforementioned processes, in particular a spatial interpolation of the location-specific weather information, determining at least one field parameter of a statistical model and/or carrying out at least one machine learning process.

The third grid may be representative for a "hyperlocal" grid in the sense that the third grid has characteristic dimensions comparable or smaller (e.g., in the same order of magnitude or at least one order of magnitude smaller) than characteristic dimensions of agricultural fields, crops, water streams and/or further vegetation. For instance, dimensions of the third grid may be defined as mean and/or minimal distance of nearest neighboring locations of the third set of locations, mean and/or minimal distance of lines of locations, and/or length, width and size of area relating to the third grid. In particular, the third grid may have characteristic dimensions that are smaller than characteristic dimensions of the first grid and the second grid. In particular, the first grid is considered "coarse," the second grid may be considered "fine" and the third grid "hyperlocal" in the aforementioned sense. Further, the third set of locations may be different from the first and/or second set of locations.

By incorporating surface topography data, the accuracy of the location-specific weather information may be improved to obtain a hyperlocal resolution on the third grid. According to an exemplary embodiment of the method according to the first aspect, said surface topography data is based on at least one of lidar data, radar data, a crop growth model, and/or a crop growth measurement. Lidar and/or radar data may provide information characteristic of the surface topography with high resolution, e.g. resolution on scales relevant in agronomic decision support, e.g. the size of agricultural fields, crops, water streams and/or further vegetation. The method may comprise performing a lidar data and/or radar data measurement to determine surface topography data.

A crop growth measurement may be utilized to determine the dimensions and/or growth stage of crop present in the area of interest. Information on the dimensions and/or growth stage of crop in the area of interest may additionally or alternatively be extracted from a crop growth model, e.g. a numerical (computer) model that is used to predict crop growth.

According to an exemplary embodiment of the method according to the first aspect, said surface topography data is indicative of surface elevation and/or surface roughness. In particular, the aforementioned surface elevation model data may refer to the elevation of the ground or soil, while the surface topography data may be also indicative of the elevation of crops, water streams, objects such as walls, fences or buildings, further vegetation such as trees and hedges. Surface roughness may be understood as surface properties that are relevant for the near surface wind, temperature and/or humidity. For example, the topography data may be indicative of the dimensions (height, width and length) of a tree and in addition indicate whether the tree has leaves or not, expressed the surface roughness. The topography data may be indicative of surface roughness in that it is reflected whether an object has a rough surface causing more wind drag (e.g. a tree) or has a smooth surface (e.g. a concrete wall).

According to an exemplary embodiment of the method according to the first aspect, said location-specific weather information for said first, second and/or third set of locations is indicative of at least one of precipitation, such as condensed atmospheric water vapor, e.g. drizzle, rain, sleet, snow, graupel and hail; wind speed; wind direction; temperature, such as air temperature and surface temperature; dew point temperature; air pressure, geopotential; absolute, specific and/or relative humidity; sunshine duration or sunshine hours, in particular per day, month and/or year; global radiation, which may refer to the total radiation (in particular shortwave radiation) from the sky onto the surface at the location, in particular direct solar radiation and/or diffuse radiation from scattered and reflected solar radiation; solar irradiance and/or solar irradiation, which may refer to the power and energy per unit area received by the surface at the location from the sun, respectively. One or more of these weather conditions may be in particular be represented in the weather model data, such as weather model data provided by an external provider, and used as an input in the method.

The location-specific weather information for said first, second and/or third set of locations may be indicative of a current weather status, i.e. the location-specific weather information may be represent weather conditions at the time the method is performed. The location-specific weather information for said first, second and/or third set of locations may be indicative of a weather forecast, in particular a numerical prediction of the time evolution of weather conditions.

According to an exemplary embodiment of the method according to the first aspect, said location-specific weather information for said first, second and/or third set of locations is indicative of at least one of near surface wind profile, near surface humidity profile, water transfer of crops, and/or near surface water balance. "Near surface" may in this regard be understood as being close enough to ground level to be relevant for agronomical decision support, e.g. the distance to the ground is comparable (in particular in the same order of magnitude) than the typical height of crops at the location indicated by the location-specific weather information. A "profile" may be understood comprising spatially resolved parameters, e.g. a set of parameters characteristic for wind and/or humidity also indicating a height above ground, e.g. a height dependence of wind and/or humidity.

According to an exemplary embodiment of the method according to the first aspect, said second grid provides a spatial resolution being higher, in particular at least one order of magnitude higher than a spatial resolution of said first grid; and/or wherein said third grid provides a spatial resolution being higher, in particular at least one order of magnitude higher than a spatial resolution of said second grid. A spatial resolution of a grid may indicate mean and/or minimal values for the distance of locations of the grid. For instance, a grid may be regular representing locations that form a rectangular or square grid in a map projection and the spatial resolution may indicate the nearest neighboring distance between the locations.

According to an exemplary embodiment of the method according to the first aspect, said first grid may comprise a spatial resolution for locations in the order of 10 km to 100 km. Such spatial resolutions are typically provided in weather model data from external service providers, in particular spatial resolutions of approximately 20 km.

According to an exemplary embodiment of the method according to the first aspect, said second grid comprises a spatial resolution for locations in the order of 500 m to 2 km. In particular, the spatial resolution is approximately 1 km. Such spatial resolutions may be comparable to available resolutions for surface elevation data and already be highly relevant for agronomic decisions, e.g. the location-specific weather information may be indicative of variations of the weather conditions within the farmland associated to the at least one user. For instance, a single measurement device may already be sufficient for the at least one user to obtain information on variations of the weather conditions in his/her farmland.

According to an exemplary embodiment of the method according to the first aspect, said third grid comprises a spatial resolution for locations in the order of 5 m to 50 m, in particular approximately 10 m. For instance, biomass, crop quality and pests may fluctuate on such very fine spatial scales. Therefore, the influence of weather conditions on these relevant agronomic factors can be adequately represented by the location-specific weather information of the third grid.

The determined location-specific weather information for said second and/or third set of locations may be given as an output to the user, e.g. by representing the determined location-specific weather information on a display and/or submitting to a device capable of displaying the determined location-specific weather information as a mobile terminal, for example. According to an exemplary embodiment of the method according to the first aspect, said location-specific weather information for said second and/or third set of locations is used in a crop growth model, a crop pathogenic risk model and/or a pest model. A crop growth model may be a numerical (computer) model that is used to predict crop growth. A crop pathogenic risk model or pest may be a numerical (computer) model that provides information on the likelihood of certain types of diseases and pests relevant for the crops, respectively. In particular, the method according to the invention may be implemented in an (automated) agronomic decision support.

According to a second exemplary aspect of the invention, a computer program code is described, the computer program code when executed by a processor causing an apparatus to perform the actions of the method according to the first aspect (and/or any of its embodiments described herein).

According to a third exemplary aspect of the invention, a (e.g. non-transitory and/or tangible) computer readable storage medium is described in which computer program code according to the second aspect (and/or any of its embodiments described herein) is stored. The computer readable storage medium could be for example a disk or a memory or the like. The computer program code could be stored in the computer readable storage medium in the form of instructions encoding the computer-readable storage medium. The computer readable storage medium may be intended for taking part in the operation of a device, like an internal or external hard disk of a computer, or be intended for distribution of the program code, like an optical disc.

According to a fourth exemplary aspect of the invention, an apparatus is described configured to realize or comprising respective means for realizing the method according to the first aspect (and/or any of its embodiments described herein).

The apparatus according to a fourth exemplary aspect of the invention is in particular an apparatus comprising:
means for obtaining weather model data indicative of location-specific weather information for a first set of locations on a first grid;
means for obtaining an area of interest associated to at least one user;
means for obtaining and/or determining a second set of locations based on a second grid within said area of interest;
means for obtaining measurement data on location-specific weather information of a measurement device associated to said at least one user located at a measurement location within and/or proximate to said area of interest; and
means for determining, based on at least said obtained weather model data and said obtained measurement data, location-specific weather information for said second set of locations based on said second grid.

The means of these apparatuses can be implemented in hardware and/or software. They may comprise for instance a processor, e.g. for executing computer program code for realizing the required functions, a memory storing the program code, or both. Alternatively, they could comprise for instance circuitry that is designed to realize the required functions, for instance implemented in a chipset or a chip, like an integrated circuit.

According to a fifth exemplary aspect of the invention, an apparatus is described comprising at least one processor and at least one memory including computer program code, the at least one memory and the computer program code configured to, with the at least one processor, cause an apparatus at least to perform the method according to the first aspect (and/or any of its embodiments described herein).

Any of the described apparatuses may comprise only the indicated components or one or more additional components. Any of the described apparatuses may be a module or a component for a device, for example a chip. Alternatively, any of the described apparatuses may be a device, for instance a server or a mobile terminal. Any of the described apparatuses may for instance at least comprise a user interface, a communication interface and/or an antenna.

In particular, any of the apparatuses may be one of a server or a part thereof; and a mobile terminal or a part thereof.

According to a sixth exemplary aspect of the invention, a system is described comprising an apparatus according to the fourth or fifth aspect (and/or any of its embodiments described herein), and at least one of: a local device configured to provide said measurement data on location-specific weather information located at a measurement location within and/or proximate to said area of interest.

In particular, said local device is at least part of a local weather station or a mobile sensor device associated with said at least one user and/or a vehicle associated with said at least one user.

The features and example embodiments of the invention described above may equally pertain to the different aspects according to the present invention.

It is to be understood that the presentation of embodiments of the invention in this section is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE FIGURES

Figure 1:
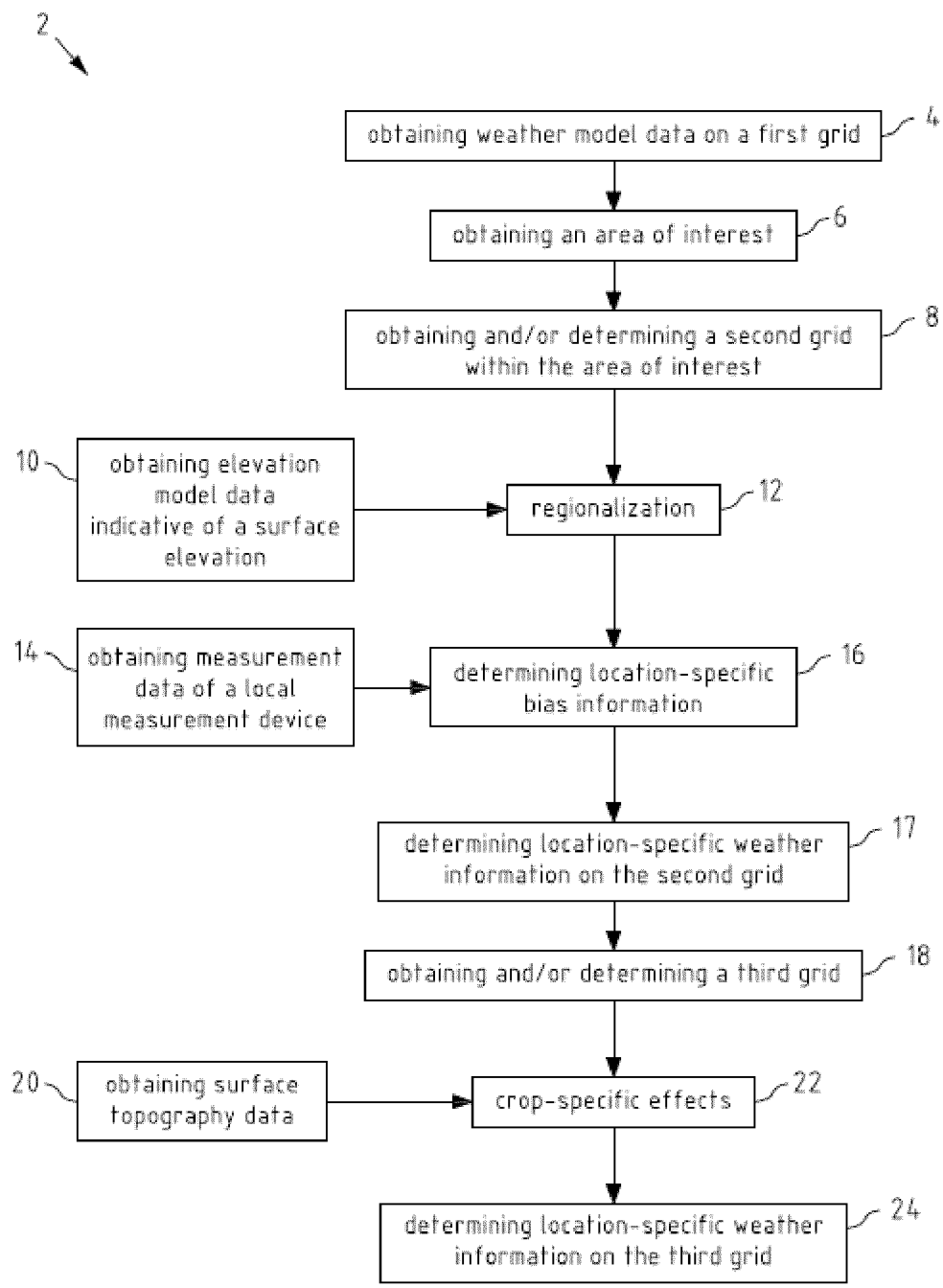
FIG. 1 is a flow chart illustrating an exemplary embodiment of a method according to the invention.

FIG. 1 is a flow chart illustrating an exemplary embodiment of a method 2 according to the invention. The method 2 is performed by at least one apparatus.

In step 4, weather model data indicative of location-specific weather information for a first set of locations on a first grid is obtained. For instance, the weather model data may be data generated on basis of a global weather model and may be provided by an external service provider. The first grid may be considered coarse and may be have a resolution that is large compared to relevant scales for agronomic decision support. The resolution may for example be in the order of 10 km to 100 km, in particular 10 km or 20 km, indicating the distance between nearest neighboring locations of the first set of locations. The location-specific weather information for the first set of locations is indicative of at least one of precipitation, wind speed, wind direction, temperature, dew point temperature, air pressure, geopotential, relative humidity, sunshine duration, global radiation and/or solar irradiation.

In Step 6, an area of interest associated to at least one user is obtained. The area of interest may represent arable land such as an agricultural field associated to the user managing the agricultural field.

In step 8, a second set of locations based on a second grid within said area of interest is obtained and/or determined. For instance, the user may specify certain points of interest within the area of interest, such as locations where certain types of crops are grown. A second grid may also be determined based on a given resolution, for example, the second grid comprises a spatial resolution for locations in the order of 500 m to 2 km, in particular around 1 km.

In this embodiment, the location-specific weather information is downscaled from the first grid to the second grid by means of at least two steps. In step 10, elevation model data indicative of a surface elevation for at least one location within and/or proximate to said area of interest is obtained. The surface elevation model is, for instance, a high-resolution DEM. The DEM may be representative for the shape of mountains, hills, lakes, water streams or valleys. The DEM may allow for a regionalization step 12, which for example takes into account regional effects such as mountain and shadowing effects, e.g. valley winds, and altitude effects, e.g. orographic precipitation.

Further, in step 14 measurement data on location-specific weather information of a measurement device associated to said at least one user located at a measurement location within and/or proximate to said area of interest is obtained. For example, the user may have access to at least one local weather station in the area of interest. The measurement data may in this regard indicate the ground truth, e.g. the actual local weather conditions at the measurement location, and be used to correct, verify, and/or select weather model data. In step 16, location-specific bias information based on deviations of said obtained weather model data and said obtained measurement data is obtained. The location-specific bias information may allow for a bias correction of the weather model data to obtain more precise location-specific weather information on the fine second grid.

In step 17, location-specific weather information for said second set of locations based on said second grid is determined. The determining is based on at least said obtained weather model data and said obtained measurement data (in particular by means of the location specific bias information and a bias correction in step 16), as well as on said elevation model data (by means of the regionalization step 12). The determining step 17 of said location-specific weather information for said second set of locations comprises a spatial interpolation of said weather model data on said second set of locations. In particular, at least one field parameter of a statistical model based at least partially on said location-specific bias information is determined, wherein determining step 17 is further based on the statistical model using said at least one field parameter. At least one machine learning process, e.g. involving an artificial neuronal net with a deep learning routine, based at least partially on said location-specific bias information may be utilized to obtain the at least one field parameter. As an alternative or in addition, a spatial process model of said weather model data and said obtained measurement data may be used.

The location-specific weather information for said second set of locations determined in step 17 may be used in a crop growth model, a crop pathogenic risk model and/or a pest model, for cases where the resolution of the second grid is already sufficient for such a model.

To obtain location-specific weather information with an even higher and in particular hyper-local resolution, this embodiment of the method involves obtaining and/or determining a third set of locations based on a third grid within said area of interest in step 18. The third grid may for example be obtained from the user or a resolution is chosen or predetermined, for example a spatial resolution for locations in the order of 5 m to 50 m, in particular around 10 m.

In step 20, surface topography data for at least one location within and/or proximate to said area of interest is obtained. Said surface topography data is indicative of surface elevation and/or surface roughness and has in particular a higher resolution than the surface elevation data. The surface topography data is based on lidar data, radar data and a crop growth model. Lidar and radar data may provide information relating to surface elevation and surface roughness with a high resolution. A crop growth model may yield information on size and growth stage of crops, further being representative for surface elevation and surface roughness. These crop-specific effects are taken into account in step 22.

In step 24, based on said obtained surface topography data and said determined location-specific weather information for said second set of locations, location-specific weather information for said third set of locations based on said third grid is determined. Weather information with hyperlocal resolution may therefore be obtained by the method.

The location-specific weather information for said second and third set of locations may be indicative of at least some of the characteristics that are also represented by the weather model data, in particular one of precipitation, wind speed, wind direction, temperature, dew point temperature, air pressure, geopotential, relative humidity, sunshine duration, global radiation and/or solar irradiation. The location-specific weather information for said first, second and/or third set of locations may be indicative of a current weather status and/or a weather forecast.

Further, in particular the downscaling on the third grid may yield additional characteristics of the location-specific weather information. For instance, incorporating crop-specific effects in step 22 may allow for the location-specific weather information for said third set of locations to be indicative of at least one of near surface wind profile, near surface humidity profile, water transfer of crops, and/or near surface water balance.

The location-specific weather information for said second and/or third set of locations may be provided to the user for agronomic decision support. In particular, the location-specific weather information is used in a crop growth model, a crop pathogenic risk model and/or a pest model such as numerical computer models. The crop growth model is in particular related to the one used for obtaining surface topography data in step 20.

Figure 2:
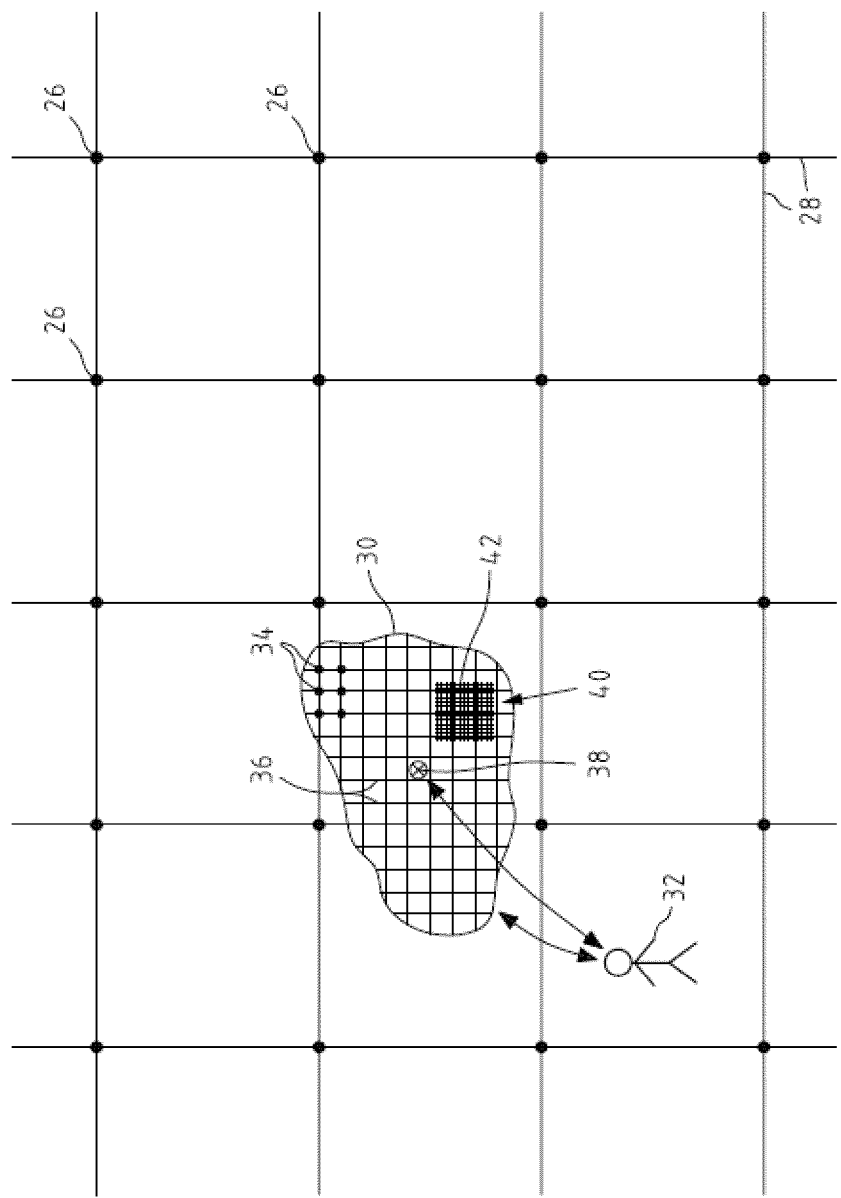
FIG. 2 is a schematic illustration of the first set of locations based on the first grid, the area of interest and the second set of locations based on the second grid.

FIG. 2 is a schematic illustration of the first set of locations 26 based on the first grid 28, which represents global weather model data on a coarse grid with 10 km resolution, for example. The area of interest 30 associated to the at least one user 32 is regional and may represent arable land such as agricultural fields associated with the user. The second set of locations 34 is based on the second grid 36 and represents a regional grid with 1 km resolution, for example. The measurement device associated to the user is located at a measurement location 38.

FIG. 2 further illustrates the third set of locations 40 based on the third grid 42. The third grid 42 may for example relate to a part of the area of interest 30 such as a specific agricultural field. The third grid 42 may be a hyperlocal grid with a resolution of 10 m and can be used to characterize weather conditions on hyperlocal scales that are important for agronomic decision support.

Figure 3:
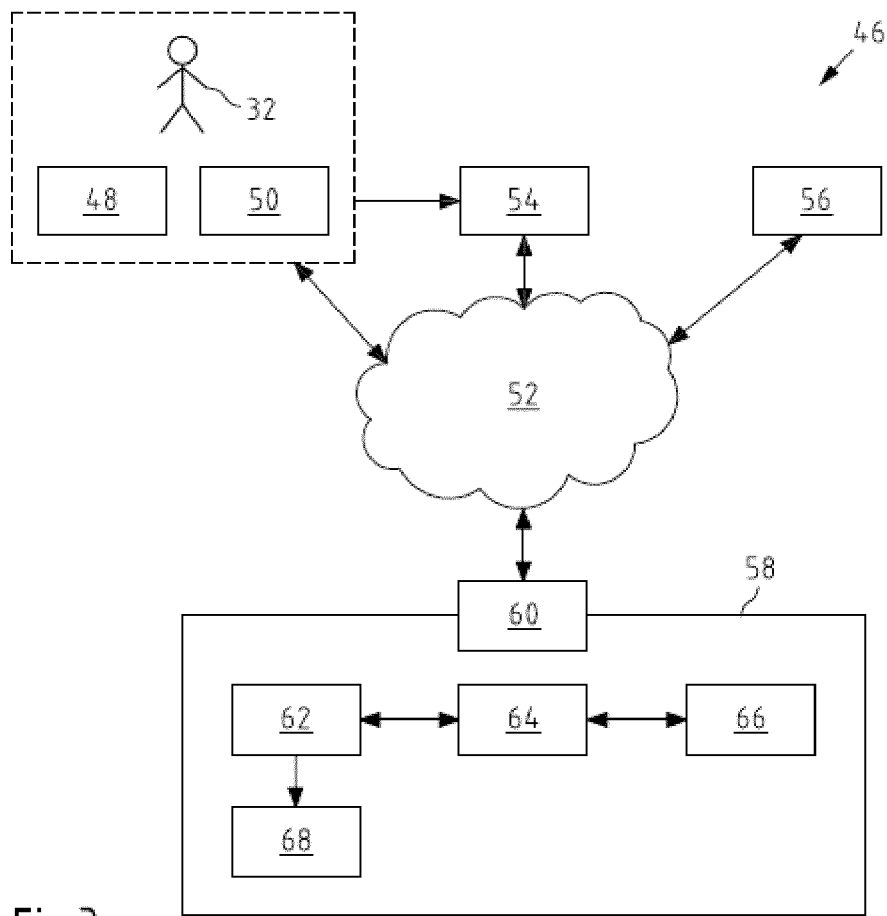
FIG. 3 is a schematic illustration of a system comprising an apparatus for performing the method according to the invention.

FIG. 3 is a schematic illustration of a system 46 comprising an apparatus for performing the method according to the invention. Measurement devices are associated with the user 32, which may be a mobile device 48 such as a handheld sensor or a sensor associated with a vehicle such as a tractor, as well as a local weather station 50. Mobile device 48 and local weather station 50 are in communication with a network 52, e.g. a local network or the internet. Mobile device 48 and local weather station 50 may further communicate with field data generator 54 that uses the measurement data to derive further information on the agricultural field.

An external weather service provider 56 may for instance provide weather model data based on a coarse first grid, and also communicate with the network 52.

Agronomic decision support system 58 comprises a communication layer 60 that communicates with network 52 and may serve to obtain weather model data, an area of interest and measurement data.

Field weather generator 62 is configured as means for determining, based on at least obtained weather model data and obtained measurement data, location-specific weather information for a second set of locations based on a second grid and/or for a third set of locations based on a third grid.

Data management means 64 may have access to data base 66 that stores weather data, such as location-specific weather information on the first, second and third grid, output from the field data generator 54 as well as model data. The weather data may for instance be used to further refine statistical models and for machine learning processes used in the method to obtain the location-specific weather information on the second and third grid. The model data may comprise parameters of statistical models and machine learning processes.

Agronomic decision support system 58 further comprises a presentation/visualization layer 68 that is configured to provide output to the user, e.g. location-specific weather information on the second and third grid.

Figure 4:
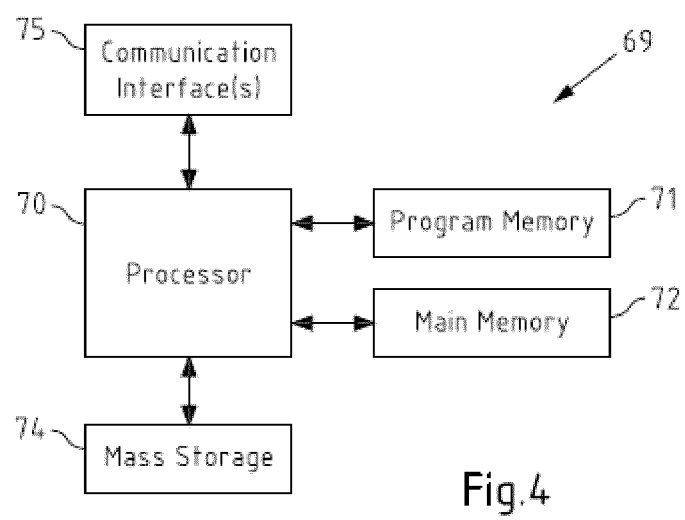
FIG. 4 is a block diagram of an apparatus for performing the method according to the invention.

FIG. 4 is a block diagram of an apparatus 69 for performing the method according to the invention. Apparatus 69 for instance is or forms a part (e.g. as a module) of a server, and may interact with clients and in particular mobile devices.

Apparatus 69 comprises a processor 70. Processor 70 may represent a single processor or two or more processors, which are for instance at least partially coupled, for instance via a bus. Processor 70 executes a program code stored in program memory 71 (for instance program code causing apparatus 69 to perform the example embodiment of a method according to the invention, when executed on processor 70). Processor 70 further interfaces with a main memory 72 (for instance acting as a working memory) and a mass storage 74, which may for instance store measurement data, weather model data and elevation model data. The measurement data, weather model data and elevation model data may for instance be stored in a database. Further, the apparatus 69 may also be able to store a model (e.g. respective model parameters of the model), e.g. in a mass storage 74. A communication interface 75 allows for a communication with a network.

Figure 5:
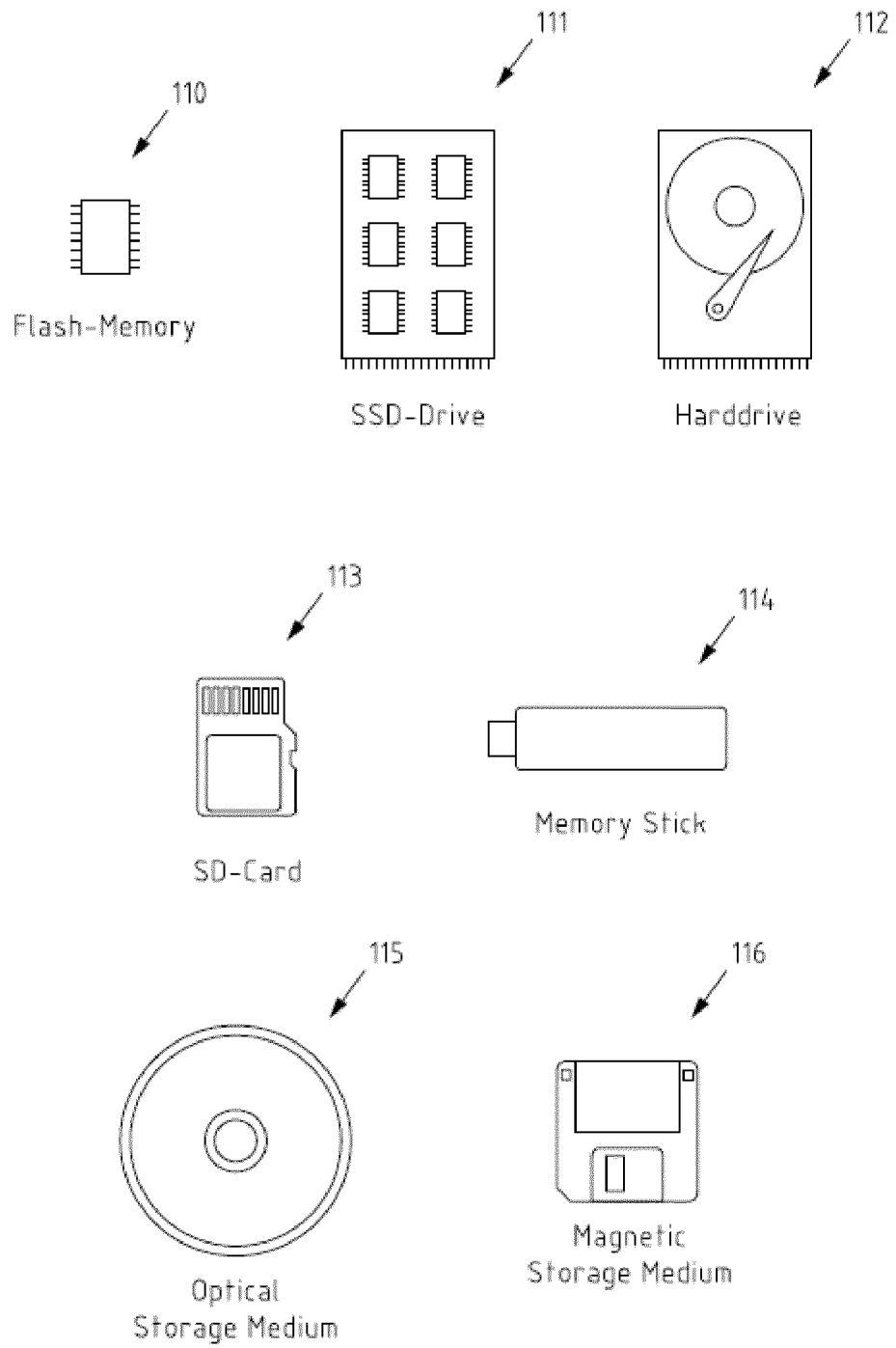
FIG. 5 is a schematic illustration of examples of tangible storage media according to the present invention.

FIG. 5 illustrates examples of tangible storage media that may for instance be used to implement program memory 71 of FIG. 4. To this end, FIG. 5 displays a flash memory 110, which may for instance be soldered or bonded to a printed circuit board, a solid-state drive 111 comprising a plurality of memory chips (e.g. Flash memory chips), a magnetic hard drive 112, a Secure Digital (SD) card 113, a Universal Serial Bus (USB) memory stick 114, an optical storage medium 115 (such as for instance a CD-ROM or DVD) and a magnetic storage medium 116.

Any of the processors mentioned in this text, in particular but not limited to processors 70 of FIG. 4, could be a processor of any suitable type. Any processor may comprise but is not limited to one or more microprocessors, one or more processor(s) with accompanying digital signal processor(s), one or more processor(s) without accompanying digital signal processor(s), one or more special-purpose computer chips, one or more field-programmable gate arrays (FPGAS), one or more controllers, one or more application-specific integrated circuits (ASICS), or one or more computer(s). The relevant structure/hardware has been programmed in such a way to carry out the described function.

Moreover, any of the actions described or illustrated herein may be implemented using executable instructions in a general-purpose or special-purpose processor and stored on a computer-readable storage medium (e.g., disk, memory, or the like) to be executed by such a processor. References to 'computer-readable storage medium' should be understood to encompass specialized circuits such as FPGAs, ASICs, signal processing devices, and other devices.

It will be understood that all presented embodiments are only exemplary, and that any feature presented for a particular exemplary embodiment may be used with any aspect of the invention on its own or in combination with any feature presented for the same or another particular exemplary embodiment and/or in combination with any other feature not mentioned. It will further be understood that any feature presented for an example embodiment in a particular category may also be used in a corresponding manner in an example embodiment of any other category.

What is claimed is:

1. A method performed by at least one apparatus, said method comprising:
   obtaining weather model data indicative of location-specific weather information for a first set of locations (26) on a first grid (28);
   obtaining an area of interest (30) associated to at least one user (32);
   obtaining and/or determining a second set of locations (34) based on a second grid (36) within said area of interest (30);
   obtaining measurement data on location-specific weather information of a measurement device associated to said at least one user located at a measurement location (38) within and/or proximate to said area of interest (30);
   determining, based at least partially on at least one machine learning process and on at least said obtained weather model data and said obtained measurement data, location-specific weather information for said second set of locations (34) based on said second grid (36);
   obtaining and/or determining a third set of locations (40) based on a third grid (42) within said area of interest (30);
   obtaining, based on at least one of a crop growth model and/or a crop growth measurement, surface topography data for at least one location within and/or proximate to said area of interest (30); and
   determining, based at least partially on the at least one machine learning process and on said obtained surface topography data and said determined location-specific weather information for said second set of locations (34), location-specific weather information for said third set of locations (40) based on said third grid (42).

2. The method according to claim 1, wherein said second grid (36) provides a spatial resolution being higher, in particular at least one order of magnitude higher than a spatial resolution of said first grid (28).

3. The method according to claim 1, further comprising:
   obtaining elevation model data indicative of a surface elevation for at least one location within and/or proximate to said area of interest (30);
   wherein said determining of said location-specific weather information for said second set of locations (34) is further based on said elevation model data.

4. The method according to claim 1, wherein said determining of said location-specific weather information for said second set of locations (34) comprises a spatial interpolation of said weather model data on said second set of locations (34); and/or a spatial interpolation of said measurement data on said second set of locations (34).

5. The method according to claim 1, further comprising:
   determining location-specific bias information based on deviations of said obtained weather model data and/or said obtained measurement data;
   wherein said determining of said location-specific weather information for said second set of locations (34) is further based on said location-specific bias information.

6. The method according to claim 5, further comprising:
determining at least one field parameter of a statistical model based at least partially on said location-specific bias information, wherein said determining of said location-specific weather information for said second set of locations (34) is further based on said statistical model using said at least one field parameter.

7. The method according to claim 5, further comprising:
carrying out at least one machine learning process based at least partially on said location-specific bias information to obtain at least one field parameter of a model for said location-specific bias information,
wherein said determining of said location-specific weather information for said second set of locations (34) is further based on said model for said location-specific bias information using said at least one field parameter.

8. The method according to claim 1, wherein said determining of said location-specific weather information for said second set of locations comprises a spatial process model of said weather model data and said obtained measurement data on said second set of locations (34).

9. The method according to claim 1, wherein said third grid (42) provides a spatial resolution being higher, in particular at least one order of magnitude higher than a spatial resolution of said second grid (36).

10. The method according to claim 1, wherein said surface topography data is further based on at least:
radar data and/or lidar data.

11. The method according to claim 1, wherein said surface topography data is indicative of surface elevation and/or surface roughness.

12. The method according to claim 1, wherein said location-specific weather information for said first, second and/or third set of locations (26, 34, 40) is indicative of at least one of precipitation, wind speed, wind direction, temperature, dew point temperature, air pressure, geopotential, relative humidity, sunshine duration, global radiation and/or solar irradiation;
and
wherein said location-specific weather information for said first, second and/or third set of locations (26, 34, 40) is indicative of a current weather status and/or a weather forecast.

13. The method according to claim 1, wherein said location-specific weather information for said first, second and/or third set of locations (26, 34, 40) is indicative of at least one of near surface wind profile,
near surface humidity profile,
water transfer of crops, and/or
near surface water balance.

14. The method according to claim 1, wherein said first grid (28) comprises a spatial resolution for locations in the order of 10 km to 100 km.

15. The method according to claim 1, wherein said second grid (36) comprises a spatial resolution for locations in the order of 500 m to 2 km.

16. The method according to claim 1, wherein said third grid (42) comprises a spatial resolution for locations in the order of 5 m to 50 m.

17. The method according to claim 1, wherein said location-specific weather information for said second and/or third set of locations (34, 40) is used in a crop growth model, a crop pathogenic risk model and/or a pest model.

* * * * *